United States Patent [19]

Ohnishi

[11] Patent Number: 5,640,029
[45] Date of Patent: Jun. 17, 1997

[54] FIELD-EFFECT TRANSISTOR AND METHOD OF PRODUCING SAME

[75] Inventor: Toyokazu Ohnishi, Toyota, Japan

[73] Assignee: Toyota Jidosha Kabushiki Kaisha, Japan

[21] Appl. No.: 551,285

[22] Filed: Oct. 31, 1995

[30] Foreign Application Priority Data

Nov. 4, 1994 [JP] Japan .................... 6-270893

[51] Int. Cl.$^6$ .................... H01L 29/80; H01L 21/26
[52] U.S. Cl. .................... 257/280; 257/279; 257/281; 257/282; 257/336; 257/344; 257/408; 257/471; 437/16; 437/20; 437/40; 437/44; 437/45; 437/141; 437/176; 437/200; 437/228
[58] Field of Search .................... 257/279, 280, 257/282, 336, 340, 344, 408, 471; 437/15, 16, 20, 40, 44, 45, 141, 176, 200, 228

[56] References Cited

U.S. PATENT DOCUMENTS 5,036,017  7/1991  Noda .................... 257/282

OTHER PUBLICATIONS

"GaAs LSI Process—Device Structure and Process Technology" T. Ohnishi et al., Semiconductor World, Jun. 1987, pp. 86–93 (with English abstract).

"A Self–Aligned Source/Drain Planar Device for GaAs MESFET Integrated Circuits", N. Yokoyama et al., Denshi–Tsushin–Gakkai (Institute of Electronics Communication Engineers of Japan), ED81-14, May 26, 1981, pp. 37–42 (with English abstract).

Primary Examiner—Edward Wojciechowicz
Attorney, Agent, or Firm—Finnegan, Henderson, Farabow, Garrett & Dunner, L.L.P.

[57] ABSTRACT

A field-effect transistor has its gate length made to be minute, and a short channel effect is prevented. The field-effect transistor which attains the above objects has first and second semiconductor regions having different impurity concentrations disposed so as to be adjacent to each other. A source electrode is disposed on the second semiconductor region with a high impurity concentration, a drain electrode on the first semiconductor region with a low impurity concentration, and a gate electrode on the first semiconductor region side of the second semiconductor region. To produce the above field-effect transistor, a production method comprises a step of forming a first semiconductor region on the major surface of a semiconductor substrate, a step of forming a gate electrode to divide the first semiconductor region, and a step of doping impurities in the first semiconductor region on one side of the gate electrode with the gate electrode as the mask, to form a second semiconductor region which is of the same conductive type with the first semiconductor region and has a different impurity concentration from the first semiconductor region.

16 Claims, 8 Drawing Sheets

5,640,029

FIELD-EFFECT TRANSISTOR AND METHOD OF PRODUCING SAME

BACKGROUND OF THE INVENTION

1. Field of the Invention

This invention relates to a field-effect transistor and a production method therefor, and more particularly to a field-effect transistor in which gate, source and drain electrodes are disposed on two semiconductor regions with different impurity concentrations, and to a production method therefor.

2. Description of the Related Art

The technical level of finely fabricated semiconductors is indicated by transistor gate length. The gate length has been in the order of submicrons for several years. In the field of semiconductor devices, in order to enable high levels of integration, the aim of establishing a technology for mass-production of semiconductor devices with a gate length of less than 0.1 micron will be continued.

Referring to the accompanying drawings, description will briefly be given of a process of producing a GaAs field-effect transistor (GaAs FET) by a conventional common method, as well as the structure of the FET. FIG. 13 through FIG. 16 show a process of forming an FET on a GaAs substrate according to the method suggested in ED81-14 of Institute of Electronics Communication Engineers of Japan, or a monthly magazine Semiconductor World, June 1987, pp. 86–93.

FIG. 13 shows a gate electrode 4 formed on an n layer 2 which has been formed in advance by ion implantation.

FIG. 14 shows that $n^+$ layer ion implantation is carried out with the gate electrode 4 as the mask. The n layer 2 remains below the gate electrode 4, but other areas are replaced with $n^+$ layers 6. At this time, however, the $n^+$ layers 6 are inert, and an $SiO_2$ protective film 8 is formed, as shown in FIG. 15, followed by annealing at about 800° C.

Lastly, FIG. 16 shows that the protective film 8 is removed, and a source electrode 10 and a drain electrode 12 are formed.

Thus, a GaAs FET is produced. In the above process, making a gate length as short as possible provides high speed and high integration. An IC produced by the above ion implantation has a planar structure and excels in control of a threshold voltage $V_{th}$, so that it has various uses such as a large scale logical IC.

According to the above process, the GaAs FET can be produced easily. However, problems due to a short channel effect arise because the gate length is now in the order of submicrons. This problem will be described with reference to FIG. 17.

FIG. 17 shows the structure of the FET shown in FIG. 16, also showing a view of an energy band taken along line B.

Since the n layer 2 just below the gate electrode is very narrow, the short channel effect, which is almost negligible in a region of 1 micron or more, suddenly becomes apparent, deteriorating the characteristics of the FET. The short channel effect roughly has the following two causes.

[Cause 1]

When the ion implantation for the $n^+$ layer 6 and the annealing for activation are carried out, implanted dopant is dispersed toward the n layer 2, causing carrier distribution within the channel broad.

[Cause 2]

A tunnel current of $n^+/i/n^+$ flows immediately below the channel.

Cause 1 is naturally expected as long as a conventional production method is employed. Cause 2 is also an unavoidable problem due to the structure of a conventional FET. The magnitude of the tunnel current is substantially proportional to a source-to-drain voltage $V_{DS}$ exponentially. With the increase of drain conductance due to this current, the channel thickness is substantially increased, and K-value is decreased.

The deterioration of the characteristics will be described with reference to FIG. 18 and FIG. 19. FIG. 18 is a graph showing the relation between the gate length and $V_{th}$ of the FET shown in FIG. 17, and FIG. 19 shows the relation between the gate length and the K-value of the same FET.

It can be seen from FIG. 18 that the absolute value of $V_{th}$ to be given increases as the gate length decreases, and controllability of the FET deteriorates considerably when the gate length is 0.5 micron. On the other hand, it can be seen from FIG. 19 that the K-value is sharply decreased when the gate length becomes 0.7 micron or below.

In view of the above, it can be seen that the FET having a gate length of submicrons, particularly less than 0.5 micron, inherently has its conventional structure limited.

SUMMARY OF THE INVENTION

This invention has been completed to remedy the above problems, and aims to provide a field-effect transistor which operates with remarkable characteristics in a very small region, and a method suitable for producing the same.

The field-effect transistor according to a first aspect of the invention comprises a first semiconductor region having a specific impurity concentration, a second semiconductor region being adjacent to the first semiconductor region and having a lower impurity concentration than the first semiconductor region, a drain electrode being connected to the first semiconductor region, a source electrode being connected to the second semiconductor region, and a gate electrode being disposed on the first semiconductor region side of the second semiconductor region.

This field-effect transistor includes the following structures: a structure where the second semiconductor region is surrounded by the first semiconductor region; a structure where the first semiconductor region is surrounded by the second semiconductor region; a structure where the first and second semiconductor regions are GaAs semiconductors; a structure where the gate electrode is tungsten silicide (WSi); and a structure where the impurities contained in the first and second semiconductor regions are silicon.

In the field-effect transistor of the invention having the above structures, the drain electrode and the source electrode are each connected to the first and second semiconductor regions having a different impurity concentration, and the gate electrode is disposed on the second semiconductor region side of the first semiconductor region. The region just below the gate electrode is nominally the part of the drain region, actually realizing an LDD (lightly doped drain) structure. This LDD structure can decrease the short channel effect regardless of the gate length. As a result, degradation of controllability due to the reduction of the gate length is suppressed, and the K-value is improved. Since this invention does not have an $n^+/i/n^+$ junction, the drain side has a low density, and the drain's withstand voltage can be increased. The field-effect transistor of the invention has a high degree of effectiveness in that theoretically, any small gate length can be used, because this invention prepares the way for further providing a microstructure, providing a drastic solution to the existing problems from a structural perspective.

The method for producing a field-effect transistor according to a second aspect of the invention comprises a first step of forming a first semiconductor region on the major surface of a semiconductor substrate, a second step of forming a gate electrode on the first semiconductor region formed by the first step to divide the first semiconductor region, and a third step of doping impurities in the first semiconductor region on one side of the gate electrode, with the gate electrode formed in the second step as the mask, to form a second semiconductor region which is of the same conductive type with the first semiconductor region and has a different majority carrier concentration from the first semiconductor region.

In one specific case of the method for producing the field-effect transistor, impurities having a concentration usable as a channel region are doped in the first semiconductor region formed in the first step, and impurities are doped in the second semiconductor region formed in the third step to make the majority carrier concentration higher than in the first semiconductor region to make it usable as a source region.

In the second specific case of the method, impurities having a concentration usable as a source region are doped in the first semiconductor region to be formed in the first step, and impurities are doped in the second semiconductor to be formed before the second step to make the majority carrier concentration lower than in the first semiconductor region to make it usable as a channel region.

In the third specific case of the method, the second step includes a first sub-step for partly masking the first semiconductor region, a second sub-step for covering the entire region with a metallic film after the first sub-step, and a third sub-step for carrying out anisotropic dry etching of the entire region covered with the metallic film in the second sub-step to remove an unnecessary metallic film and to leave the metallic film in the form of a wall on the side face at the mask end; and the region masked in the first sub-step is prevented from being doped with the impurities in the third step and the metallic film wall left in the third sub-step forms a gate electrode.

In other cases, the gate electrode may be formed in the second step into a form crossing the first semiconductor region, the gate electrode may be formed in the second step into a form partly surrounding the first semiconductor region, or the semiconductor substrate may be a GaAs semiconductor substrate. Besides, in the third specific case of the method, the mask of the first sub-step is formed of a photoresist, the metallic film in the second sub-step is made of tungsten silicide, and the anisotropic dry etching in the third sub-step is an electron cyclotron resonance (ECR) ion shower etching treatment.

In the first specific case of the method, silicon ions (Si$^+$) are doped in a GaAs semiconductor substrate to form the first semiconductor region, the first semiconductor region is partly masked with a SiN film by lithography, a tungsten silicide film is vapor-deposited on the entire first semiconductor region by sputtering, the tungsten silicide film is etched by the ECR ion shower etching to form a wall-shaped gate electrode on the side wall of the SiN mask end, and silicon ions are doped with the SiN film and the gate electrode as the mask to form the second semiconductor region.

According to the method for producing the field-effect transistor according to the invention, the first semiconductor region is formed on the major surface of the semiconductor substrate in the first step, the gate electrode having such a shape as to divide the first semiconductor region is formed thereon in the second step, and the impurities are doped in the first semiconductor region on one side of the gate electrode with the gate electrode as the mask in the third step, to form the second semiconductor region having the same conductive type as the first semiconductor region and having a majority carrier concentration different from the first semiconductor region.

In the third specific case of the method for producing the field-effect transistor of the invention, the second step includes the following sub-steps. Specifically, the first sub-step partly masks the first semiconductor region, the second sub-step covers the entire region with a metallic film, and the third sub-step treats the entire region with an anisotropic dry etching process to remove an unnecessary metallic film. As a result, the metallic film in the form of a wall is left on the side face at the mask end. By virtue of the above sub-steps, the masked region is prevented from being doped by the impurities in the following third step, and the wall-shaped metallic film left in the third sub-step becomes the gate electrode.

The above production method according to the invention dopes the impurities in the first semiconductor region on one side of the gate electrode, facilitating the production of the field-effect transistor having the above described LDD structure. The mask partly applied to the first semiconductor region makes it possible to prevent the impurities from being doped in the gate electrode forming step and following steps, and after determinating of a location where masking is to be carried out, the formation of the gate electrode and the second semiconductor region based on self-alignment makes it possible to further shrink the gate length.

DESCRIPTION OF PREFERRED EMBODIMENTS

First Embodiment 1

One embodiment of the production method of the invention will be described with reference to the drawings. FIG. 1 through FIG. 7 show a production method of the invention with respect to a GaAs MESFET. Referring to these drawings, each step will be described.

Figure 1:
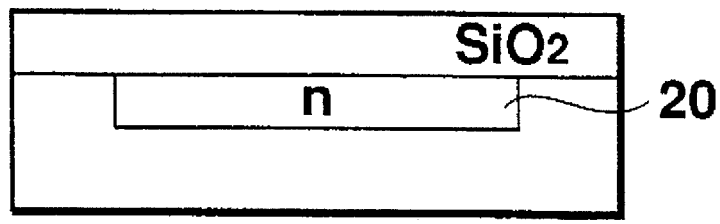
FIG. 1 shows a production method of the invention with respect to a GaAs MESFET, illustrating a diffused layer formed, which becomes a channel region.

Step 1—FIG. 1

To form an n layer 20 on a GaAs substrate, $Si^+$ ions are doped, and an $SiO_2$ protective film having a thickness of about 100 nanometers (nm) is formed by CVD (chemical vapor deposition). Activation annealing (at 950° C., for about 5 seconds) is performed, and the $SiO_2$ protective film is removed with a hydrofluoric acid-based solution. As a result, the n layer 20 is formed as a channel region.

Figure 2:
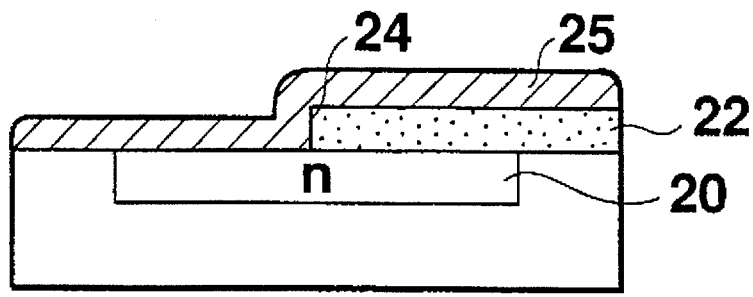
FIG. 2 shows a production method of the invention with respect to a GaAs MESFET, illustrating a WSi film formed, which becomes a gate electrode.

Step 2—FIG. 2

A SiN film 22 is formed by plasma CVD to the right half of the n layer 20 as illustrated. A side 24 of the resist 22 is made as perpendicular to the substrate as possible. Then, a WSi film having a thickness of about 500 nm is wholly vapor-deposited by sputtering.

Figure 3:
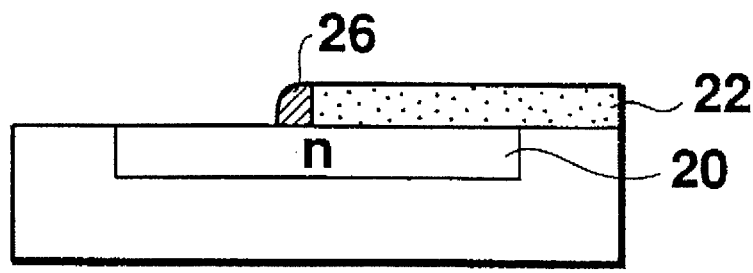
FIG. 3 shows a production method of the invention with respect to a GaAs MESFET, illustrating the gate electrode formed on the side of a SiN film by dry-etching the WSi film.

Step 3—FIG. 3

The WSi film is subject to anisotropic dry etching by $CF_4+O_2$ (10%) gas with an ECR ion shower etching device. Etching is vertically progressed, leaving a thin metallic wall along the side 24. This metallic wall is a gate electrode 26.

Figure 4:
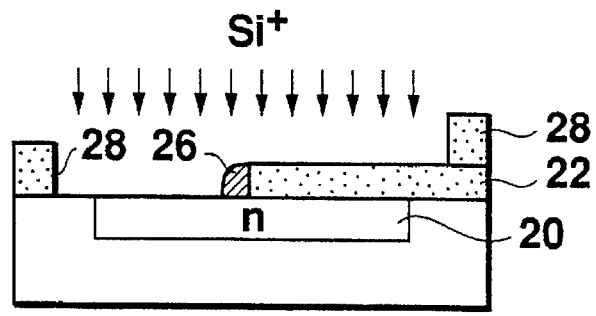
FIG. 4 shows a production method of the invention with respect to a GaAs MESFET, illustrating a step of doping ions to form a source region with a SiN film and a gate electrode as a mask.

Step 4—FIG. 4

Before doping $n^+$ ions, a photoresist 28 is applied to either end to prevent adjacent devices from being doped. After doping $n^+$ ions, the photoresist 28 and the SiN film 22 on the n layer 20 are removed.

Figure 5:
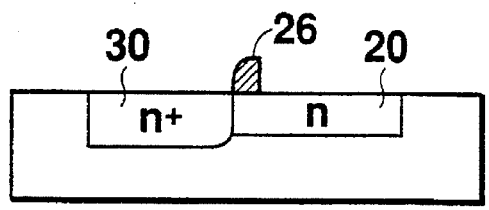
FIG. 5 shows a production method of the invention with respect to a GaAs MESFET, illustrating a completed source region.

Step 5—FIG. 5

To activate an $n^+$ ion layer, activation annealing is performed with an $SiO_2$ protective film having a thickness of about 100 nm formed by CVD. Then, the $SiO_2$ protective film is removed. As a result, an $n^+$ layer 30 is completed.

Figure 6:
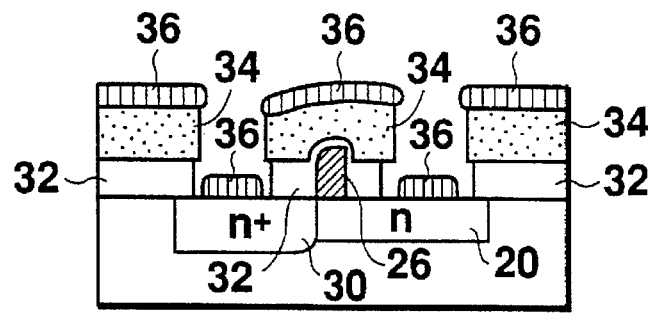
FIG. 6 shows a production method of the invention with respect to a GaAs MESFET, illustrating a step of forming source and drain electrodes.

Step 5—FIG. 6

Source and drain electrodes are disposed according to a conventional method. Specifically, an $SiO_2$ film 32 having a thickness of about 300 nm and a photoresist film 34 are formed in this order on the entire top face. The photoresist film 34 is perforated by lithography in areas where a source electrode and a drain electrode are disposed. Then, the $SiO_2$ 32 in the perforated openings is removed by etching with a hydrofluoric acid-based solution. AuGe/Ni/Au 36 are vapor-deposited in this order, each to a thickness of 100/100/300 nm respectively, by vacuum deposition.

Figure 7:
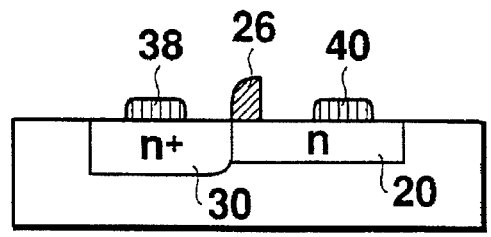
FIG. 7 shows a production method of the invention with respect to a GaAs MESFET, illustrating a completed source electrode and a drain electrode completed.

Step 7—FIG. 7

The photoresist 34 is dissolved by penetration of an organic solvent such as acetone. The metallic film on the photoresist 34 is removed at the same time. Thus, a source electrode 38 and a drain electrode 40 are completed by a liftoff method. Lastly, thermal treatment is carried out at 400° C. for about 10 seconds, AuGe and GaAs are mixed by an alloy method to obtain required Ohmic characteristics.

The above is the production method of this example.

The features of the production method will be described. The production method of the above example has features which are different from a conventional method. Specifically, differing from the conventional method, the $n^+$ ions are doped on only one side of the gate electrode 26 (on the source side in this example). Also, the gate electrode 26 and the SiN film 22 are used as the mask to prevent the other side (drain side) from being doped.

Assuming that the gate is solely formed in the same way as the conventional method, as the gate length is shrunk, it is quite difficult to produce an FET whose source and drain regions are formed by different steps, or to dope ions on one side of the gate. This is because it is difficult to accurately form the resist film on one side (the right side in this example) of the center of the very thin gate. The conventional method almost reaches its limitations when the gate length is about 1 micron (μm).

It is to be noted that according to the production method of the invention, the initial determination of the position of the SiN film 22 determines the position of the gate electrode 26 and the position where the $n^+$ ions are doped by self-aligning. Thus, it is not necessary to leave a design margin which is generally required for aligning the mask. Besides, the production method of the invention can make the gate length as small as desired. Therefore, this production method can easily deal with a case where the gate length is further shrunk.

In this embodiment, a GaAs FET has been used as an example in the description, but other processes may also be used. Also, the embodiment has formed the $n^+$ layer on the source side after forming the n layer, but may form the $n^+$ layer first and dope p ions on the drain side. It suffices when the two semiconductor regions formed are the same conductive type.

Second Embodiment

Description will be made of a field-effect transistor of the invention to be produced by the production method of Embodiment 1 or its equivalent method.

Figure 8:
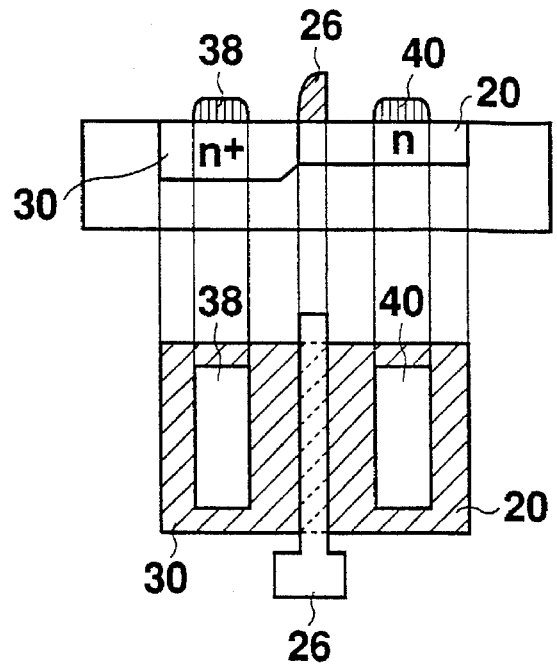
FIG. 8 shows a cross-sectional view and a top view of a field-effect transistor (FET) of the invention with respect to a GaAs MESFET.
Figure 16:
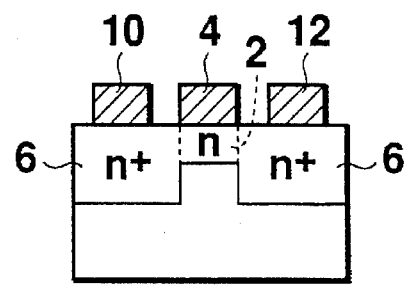
FIG. 16 shows a process of forming an FET on a GaAs substrate by a conventional method, illustrating a source electrode and a drain electrode thus formed.

FIG. 8 shows a cross-sectional view and a top view of a field-effect transistor of the invention with respect to a GaAs MESFET. As illustrated, this FET has the gate electrode 26, the source electrode 38 and the drain electrode 40, and its features are as follows. As shown in FIG. 16, a conventional FET has the $n^+$ layer 6 just below the drain electrode 12, but in this invention, the gate electrode 26 and the drain electrode 40 have the n layer 20 just below them. In other words, the FET which has been formed of at least three doped regions by a conventional method can be made of only two major doped regions, realizing an LDD structure.

Description will be given for a case where the short channel effect is lowered in the FET of the present invention owing to the above structure.

Figure 9:
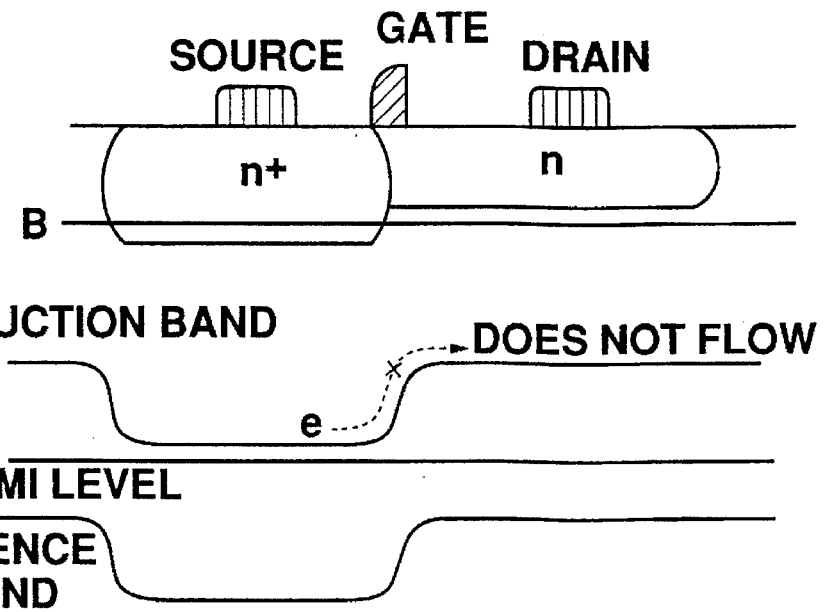
FIG. 9 shows a cross-sectional view of the FET shown in FIG. 8 and a corresponding energy band diagram.
Figure 17:
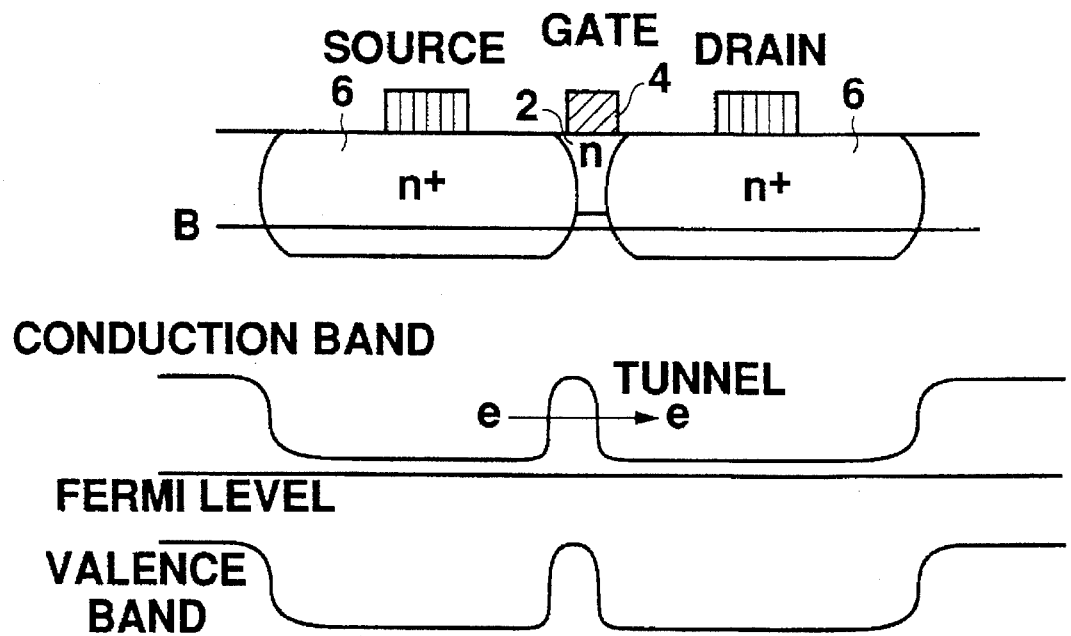
FIG. 17 is a cross-sectional view of the FET shown in FIG. 16 and a corresponding energy band diagram.

FIG. 9 shows the structure of the FET of FIG. 8, also illustrating an energy band diagram taken along line B. A narrow layer like the n layer 2 as shown in FIG. 17 is not present just below the channel of the FET, so that the short channel effect does not occur regardless of the gate length. This is because the causes 1 and 2 of the short channel effect, described as the problems of the prior art, do not take place owing to no doping of the n$^+$ ions into the drain side region. Thus, the FET of the invention completely remedies the existing problems from a structural standpoint.

Figure 10:
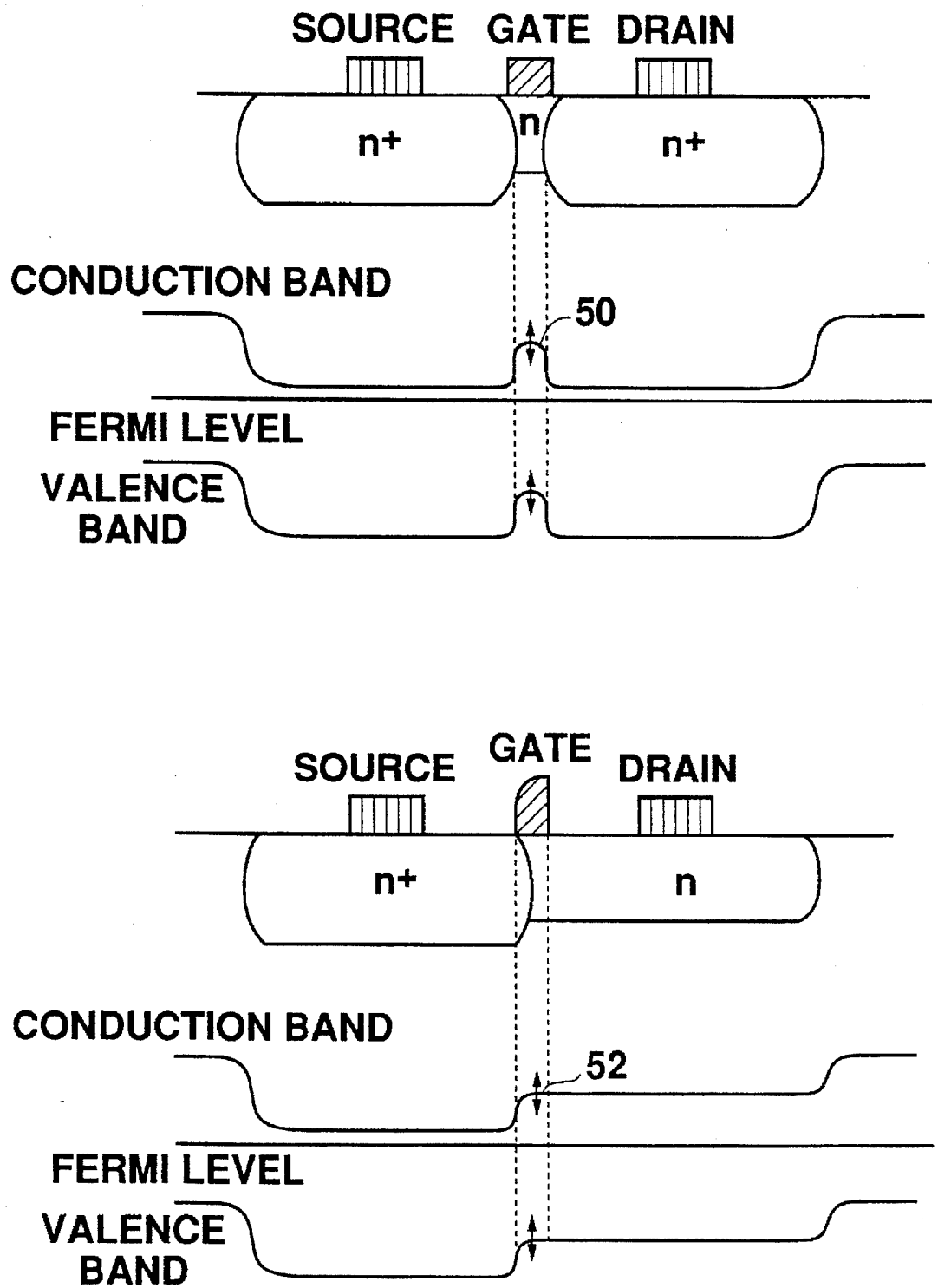
FIG. 10 shows a potential barrier just below a gate.

Referring to FIG. 10, the operation principle of the FET of the invention will be compared with that of a conventional FET.

FIG. 10 shows a potential barrier just below the gate. The upper part shows that the gate voltage of the conventional FET is changed to adjust $I_{DS}$, and the lower part shows the same of the FET of this invention.

It is apparent from the drawing that the $I_{DS}$ was conventionally controlled by vertically moving a gate voltage 50 just below the narrow gate, but this invention controls the $I_{DS}$ by vertically moving a shoulder 52 of the potential barrier because the potential difference between the gate and the drain is substantially small. Therefore, a very long and high potential barrier exists on the drain side, and a tunnel current can be prevented from occurring.

When operating, a bias voltage is applied to the FET, so that the potential barrier decreases toward the right side in the drawing. As a result, electrons exceeding above the shoulder from the source side reach the drain without fail, and a stable operation is assured.

The features of the FET of the invention will be described with reference to FIG. 11 and FIG. 12.

Figure 11:
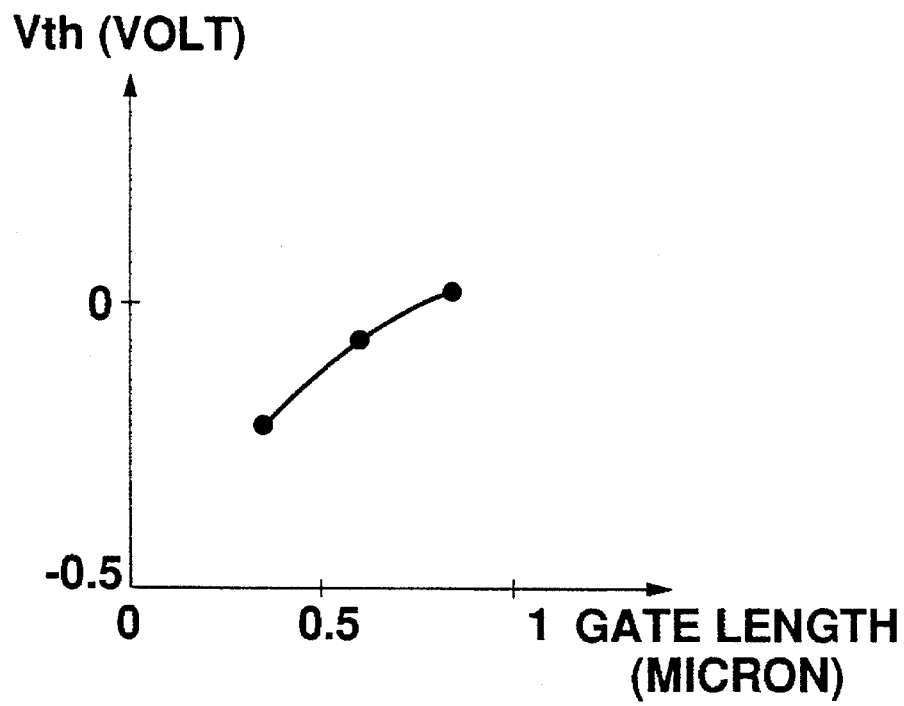
FIG. 11 shows the relation between a gate length and $V_{th}$ of the FET of the invention.
Figure 12:
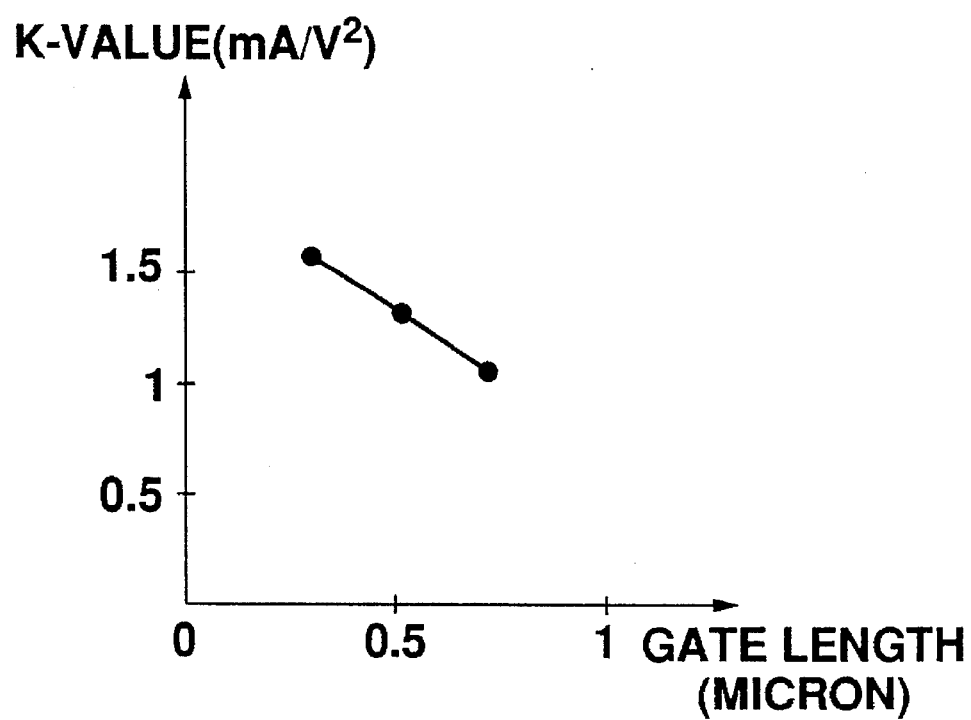
FIG. 12 shows the relation between a gate length and K-value of the FET of the invention.
Figure 13:
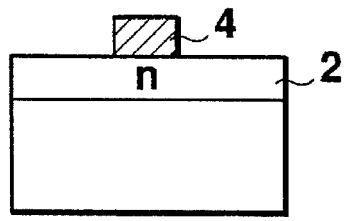
FIG. 13 shows a process of forming an FET on a GaAs substrate by a conventional method, illustrating a gate electrode formed after forming a channel region.
Figure 14:
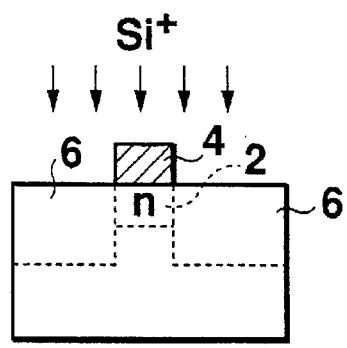
FIG. 14 shows a process of forming an FET on a GaAs substrate by a conventional method, illustrating a step of doping ions with a gate electrode as a mask.
Figure 15:
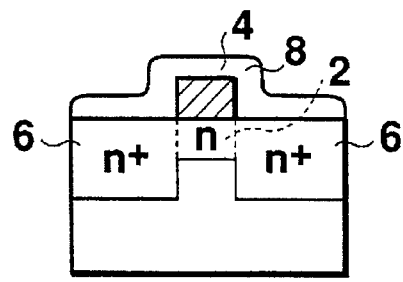
FIG. 15 shows a process of forming an FET on a GaAs substrate by a conventional method, illustrating a source region and a drain region formed by annealing.
Figure 18:
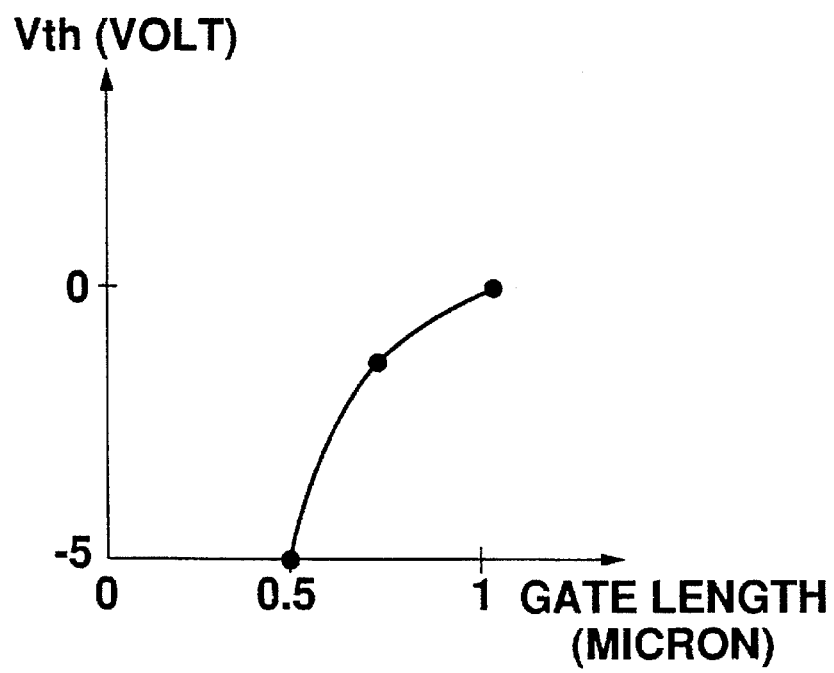
FIG. 18 shows the relation between a gate length and $V_{th}$ of the FET shown in FIG. 17.
Figure 19:
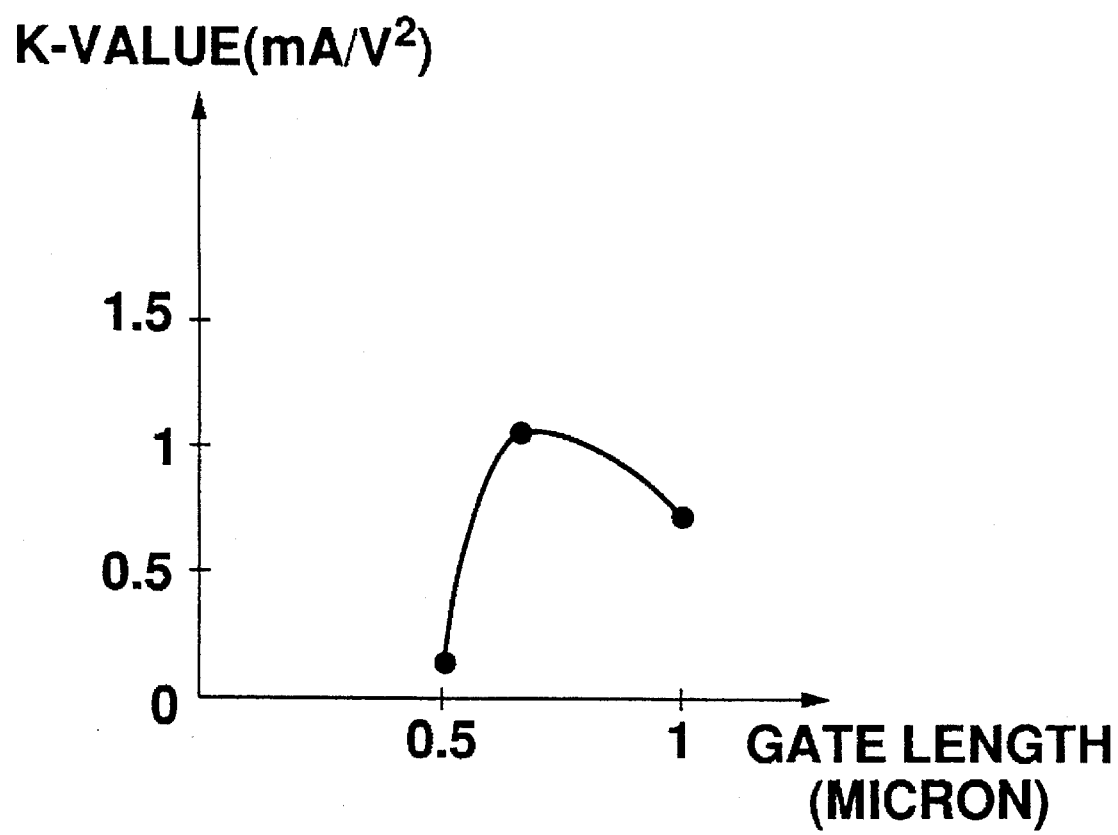
FIG. 19 shows the relation between a gate length and K-value of the FET shown in FIG. 17.

FIG. 11 shows the relation between a gate length and $V_{th}$ of the FET, and FIG. 12 shows the relation between a gate length and K-value of the FET, corresponding to FIG. 18 and FIG. 19 of the conventional FET.

It is apparent from FIG. 11 that in the FET of the invention the increase of the absolute value of $V_{th}$ as the gate length is considerably smaller than that of the conventional FET, but deterioration of its controllability is reduced. On the other hand, it is seen from FIG. 12 that the K-value of the FET of the invention increases as the gate length decreases. This feature is very advantageous for the FET.

In view of the above, the FET of the invention exhibits very good characteristics even when the gate length is in the order of sub-microns, and particularly shorter than 0.5 micron. The FET of the invention can theoretically adopt a short gate length without limitation according to the production method described in Example 1 or its equivalent method, and this method is very effective.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A field-effect transistor comprising:
   a first semiconductor region having a prescribed impurity concentration;
   a second semiconductor region being adjacent to the first semiconductor region and having a lower impurity concentration than the first semiconductor region;
   a source electrode being connected to the first semiconductor region;
   a drain electrode being disposed on the second semiconductor region; and
   a gate electrode being disposed on the first semiconductor region side of the second semiconductor region.

2. The field-effect transistor according to claim 1, wherein the second semiconductor region is surrounded by the first semiconductor region.

3. The field-effect transistor according to claim 1, wherein the first semiconductor region is surrounded by the second semiconductor region.

4. The field-effect transistor according to claim 1, wherein the first semiconductor region and the second semiconductor region are GaAs semiconductors.

5. The field-effect transistor according to claim 1, wherein the gate electrode is tungsten silicide (WSi).

6. The field-effect transistor according to claim 1, wherein the impurities contained in the first and second semiconductor regions are silicon.

7. A method for producing a field-effect transistor comprising:
   a first step of forming a first semiconductor region on the major surface of a semiconductor of a semiconductor substrate;
   a second step of forming a gate electrode on the first semiconductor region formed by the first step, to divide the first semiconductor region; and
   a third step of doping impurities in the first semiconductor region on one side of the gate electrode, with the gate electrode formed in the second step as a mask, to form a second semiconductor region which is of the same conductivity type as the first semiconductor region and has a different majority carrier concentration from the first semiconductor region, wherein
   said second step includes:
     a first substep of forming a mask on a part of said first semiconductor region,
     following the first substep, a second substep of forming an electrode film in a region over said mask and said first semiconductor region, and
     a third substep of carrying out anisotropic dry etching over the entire region covered by the electrode film to remove an unnecessary part of said electrode film, and to leave said electrode film in a wall-like shape along a side face at an end adjacent said mask, such that doping of the impurities in a region masked in the first substep is prevented during the third step, and doping of the impurities in a region adjacent the wall-like shaped electrode is prevented during the third step, said wall-like shaped electrode forming a gate electrode of said field-effect transistor.

8. The production method according to claim 7, wherein impurities having a concentration usable as a channel region are doped in the first semiconductor region formed in the first step, and impurities are doped in the second semiconductor formed in the third step to make the majority carrier concentration higher than in the first semiconductor region, to make it usable as a source region.

9. The production method according to claim 7, wherein impurities having a concentration usable as a source region are doped in the first semiconductor region formed in the first step, and impurities are doped in the second semiconductor region formed before the second step to make the majority carrier concentration lower than in the first semiconductor region, to make it usable as a channel region.

10. The production method according to claim 7, wherein the gate electrode is formed in the second step into a shape crossing the first semiconductor region.

11. The production method according to claim 7, wherein the gate electrode is formed in the second step into a shape partly surrounding the first semiconductor region.

12. The production method according to claim 7, wherein the semiconductor substrate is a GaAs semiconductor substrate.

13. The production method according to claim 7, wherein the mask in the first sub-step is formed of a photoresist.

14. The production method according to claim 7, wherein the metallic film in the second sub-step is made of tungsten silicide.

15. The production method according to claim 7, wherein the anisotropic dry etching in the third sub-step is an electron cyclotron resonance (ECR) ion shower etching treatment.

16. The production method according to claim 8, wherein silicon ions ($Si^+$) are doped in a GaAs semiconductor substrate to form the first semiconductor region, the first semiconductor region is partly masked with a photoresist film by lithography, a tungsten silicide film is vapor-deposited on the entire first semiconductor region by sputtering, the tungsten silicide film is etched by the ECR ion shower etching to form a wail-shaped gate electrode on the side wall of the photoresist mask end, and silicon ions are doped, with the photoresist film and the gate electrode as the mask, to form a second semiconductor region.

* * * * *